United States Patent
Kobayashi et al.

[11] Patent Number: 5,991,155
[45] Date of Patent: Nov. 23, 1999

[54] HEAT SINK ASSEMBLY INCLUDING FLEXIBLE HEAT SPREADER SHEET

[75] Inventors: Takashi Kobayashi; Takashi Nonaka, both of Tokyo, Japan

[73] Assignee: Mitsubishi Denki Kabushiki Kaisha, Tokyo, Japan

[21] Appl. No.: 08/988,378

[22] Filed: Dec. 10, 1997

[30] Foreign Application Priority Data

Dec. 13, 1996 [JP] Japan .................................. 8-334017

[51] Int. Cl.⁶ ................................................. H05K 7/20
[52] U.S. Cl. ...................... 361/705; 361/704; 361/706; 361/751; 257/723; 165/80.2; 174/252
[58] Field of Search ................................. 361/699, 687, 361/683, 690–697, 702–710, 719, 751, 749; 165/80.3, 80.2, 185, 46, 80.4, 165, 102.33, 102.39; 257/713–718, 659, 779; 439/66, 91, 178; 174/16.3, 260, 252, 50.2, 35 R

[56] References Cited

U.S. PATENT DOCUMENTS 4,442,540  4/1984  Lipschutz et al. ..................... 357/81
5,133,403  7/1992  Yokono et al. ......................... 165/185
5,673,176  9/1997  Penniman et al. ..................... 361/720

FOREIGN PATENT DOCUMENTS 6134917  5/1994  Japan .
823183   1/1996  Japan .

Primary Examiner—Leo P. Picard
Assistant Examiner—Michael Datskovsky
Attorney, Agent, or Firm—Leydig, Voit & Mayer

[57] ABSTRACT

In a heat sink, a portable electronic apparatus using this heat sink, and a method for forming this heat sink, an abutting member is arranged on an inside surface of a casing and the casing and the abutting member are covered with a heat spreader sheet. The heat spreader sheet is made to abut against an exothermic device by means of an abutting member. The heat generated in the exothermic device is transmitted to the inside wall surface of the casing via the heat spreader sheet, with a portion being transmitted via the abutting member. When an anisotropic thermal conductivity material is used for the abutting member, it is possible to realize characteristics such as a low peak casing temperature under the exothermic device.

16 Claims, 7 Drawing Sheets

HEAT SINK ASSEMBLY INCLUDING FLEXIBLE HEAT SPREADER SHEET

BACKGROUND OF THE INVENTION

1. Field of the Invention

The present invention relates to a heat sink for cooling an exothermic device, such as a microprocessor, utilizing a heat spreader sheet; a method for forming such a heat sink; and a portable electronic apparatus using such a heat sink.

2. Description of the Related Art

Various electronic devices such as microprocessors are undergoing miniaturization with their operating frequencies being shifted toward higher ranges. With this trend, efficient means for cooling these electronic devices are more and more urgently required. Particularly, a heat sink to be installed in portable electronic apparatuses in which compactness and light weight are required, must be capable of cooling an exothermic device (a device which easily generates heat energy) as efficiently as possible in addition to being light and compact. As a method for answering the first requirement for compactness and light weight, there is a method for transmitting the heat generated in an electronic device to a casing and for cooling the casing by natural air cooling. Because no parts for forced air cooling are necessary in this method, it is possible to provide a heat sink which is smaller and lighter than by using a forced air cooling method.

It is possible to realize a more compact and light weight heat sink using a graphite or graphite composite sheet, as is disclosed in Japanese Patent Laid-Open Publication No. Hei 6-134917 and Japanese Patent Laid-Open Publication No. Hei 8-23183, as a means for transmitting the heat generated in an exothermic device to the device's casing. In addition, graphite and graphite composite materials are also useful for effective cooling, the second requirement for a heat sink of a portable electronic apparatus, because of their high thermal conductivity. FIG. 11 shows a portable electronic apparatus in which a sheet made of graphite or graphite composite materials is used to transmit heat from an exothermic device to a casing. In this figure, exothermic device 1, such as a microprocessor, for example, is mounted on circuit board 2, which is contained in casing 3 of the portable electronic apparatus. Heat spreader sheet 4 made of graphite or graphite composite material is formed by drawing, and assembled into the portable electronic device. Heat spreader sheet 4 is fixed to the inside wall of casing 3 so that the drawn part of heat spreader sheet 4 comes in to contact with exothermic device 1.

However, deep drawing of graphite or graphite composite material is generally difficult because of the material's flexibility. Therefore, when heat spreader sheet 4 must be drawn to come in contact with exothermic device 1, the heat spreader sheet 4 can not be prevented from having a slightly curved shape, as shown FIG. 11. With such a shape, it is difficult to effectively transmit the heat generated in exothermic device 1 to heat spreader sheet 4 because it is difficult for spreader sheet 4 to contact a surface of exothermic device 1. Further, it is difficult to effectively radiate the heat generated in exothermic device 1 to the outside of casing 3 because the distance of heat transmission of heat spreader sheet 4, that is, the distance from exothermic device 1 to the inside wall surface of casing 3, is lengthened. Still further, in order to avoid interference or contact of heat spreader sheet 4 having a gentle slope with adjacent device 5 mounted on circuit board 2, the interval between exothermic device 1 and adjacent device 5 should be somewhat large. As a result, the usable space for mounting electronic apparatus on circuit board 2 is decreased, creating an obstacle to miniaturization of portable electronic apparatus. Further, when an electrically conductive surface such as graphite is exposed on a surface of heat spreader sheet 4, a particularly large interval should be part of the design in order to avoid contact of heat spreader sheet 4 with lead wires of adjacent device 5, in order to avoid a short circuit between casing 3 and the lead wires. When it is impossible for heat spreader sheet 4 to contact exothermic device 1, such a shape becomes unnecessary. However, effective thermal conduction, diffusion, or transfer can not be expected under such a non-contact condition.

SUMMARY OF THE INVENTION

A first object of the present invention is to improve the overall efficiency of the radiating and cooling process, including a process of transmitting the heat from the exothermic device to the inside wall surface of the casing (generally a low temperature surface), via the heat spreader sheet, while the heat spreader sheet is made of a flexible material having high thermal conductivity, such as graphite or graphite composite. A second object of the present invention is to reduce the required space for mounting electronic apparatus to enable the miniaturization of apparatus by avoiding contact or interference of the heat spreader sheet with an adjacent device, while the heat spreader sheet is made of a flexible material having high thermal conductivity. In the present invention, these first and second objects are achieved by using small additional members to bring the heat spreader sheet into contact with the exothermic device.

A third object of the present invention is to realize a structure that does not create a heavy load on the exothermic device and that can perform effective cooling. In the present invention, the third object is achieved by reducing the load applied to the exothermic device by forming the heat spreader sheet using a flexible material of high thermal conductivity, and by making the load of the exothermic device uniform regardless of actual mounted forms (e. g. inclination of a top surface, etc.) of the heat spreader sheet and the exothermic device. This is done by designing the structure so that the heat spreader sheet comes in contact with the exothermic device. A fourth object of the present invention is to improve cooling performance by including a means for fixing the heat spreader sheet to a low temperature surface and a member for making the heat spreader sheet contact with the exothermic device.

In a heat sink according to the present invention, an abutting member having a table-like external surface is arranged on a low temperature surface so as to face an exothermic device arranged on a circuit board. Next, the low temperature surface is covered with the heat spreader sheet made of materials having thermal conductivity and flexibility so that the contour of the external surface of the abutting member can approximately be recognized. In addition, a portion of the heat spreader sheet is fixed to the low temperature surface. Consequently, because part of the heat spreader sheet abuts against the exothermic device and the abutting member, and other portion of the heat spreader sheet is fixed to the low temperature surface, the heat generated in the exothermic device is transmitted to the low temperature surface via the heat spreader sheet and the abutting member.

Therefore, according to the present invention, the shape of the heat spreader sheet at the position where the heat spreader sheet comes into contact with the exothermic device is restricted to the external surface of the abutting member. Consequently, it is possible to prevent such a gentle shape of the heat spreader sheet as appears when the heat spreader sheet is manufactured by drawing. It is thereby possible to reduce the distance of heat transmission by the heat spreader sheet and to prevent the contact or the interference of the heat spreader sheet with the adjacent device. At the same time, because the contact condition of the surfaces of the heat spreader sheet and the exothermic device is stabilized, the transmission of the heat from the exothermic device to the heat spreader sheet can be efficiently accomplished. In addition, because heat is directly transmitted from the heat spreader sheet to the low temperature surface at the fixed position of the heat spreader sheet and via the abutting member at the arranged position of the abutting member, heat is efficiently transmitted. As the result of these effects, efficient radiating and cooling is accomplished by improving the efficiency of heat transmission from the exothermic device to the low temperature surface via the heat spreader sheet, allowing the intervals between adjacent devices and the actual mounting space to be reduced. Miniaturization of the apparatus can thus be promoted.

In addition, in the present invention, it is desirable that line notches, which are not parallel with each other, are formed beforehand on the heat spreader sheet. A projected containing part for receiving the abutting member is then formed by bending the heat spreader sheet along the direction crossing the notches. In this way, the gentle shape of the heat spreader sheet around the abutting member can be prevented. In the present invention, it is desirable that the heat spreader sheet be fixed to the low temperature surface using heat conductive adhesive. In this way, transmission of the heat from the heat spreader sheet to the low temperature surface can be efficiently carried out. In the present invention, it is desirable that an elastic supporting frame be arranged between the abutting member and the low temperature surface so that the stress due to abutting of the heat spreader sheet is uniformly distributed along the exothermic device. In this way, efficient transmission of the heat from the exothermic device to the heat spreader sheet is possible regardless of spacing of the heat spreader sheet and the exothermic device. In addition, when a spacer having an aperture is employed, it is possible to prevent local temperature rise at a part of the casing because a thermal insulation layer is formed by air inside the aperture. In addition, because the stress applied on the exothermic device is reduced, it is possible to provide a structure particularly suitable for cooling delicate parts, such as bare chips. In the present invention, it is desirable that the abutting member and the supporting frame be made of one of either resinous materials, which are lighter than metallic materials; metallic materials, which have higher thermal conductivity than resinous materials; or anisotropic materials, which have high thermal conductivity in the direction parallel to the low temperature surface and the mounting surface of the exothermic device of the circuit board and have low thermal conductivity in the direction crossing these surfaces. Particularly, the advantage of light weight can be obtained by resinous materials and the advantage of improved cooling performance can be obtained by metallic materials. In addition, when anisotropic thermal conductivity materials are arranged in the above-mentioned way, cooling performance is furthermore improved, and the weight can furthermore be reduced. In this case, it is desirable to design the contour of the heat spreader sheet so as not to disturb the heat transmission.

The present invention can be represented as other than a heat sink. The present invention is also, for example, a portable electronic apparatus, wherein the above-mentioned circuit board, the casing in which the circuit board is contained, and the inside wall surface of the casing serves as the low temperature surface, and the above-mentioned heat sink are provided for cooling the outside wall surface of the casing by natural air cooling. Such a portable electronic apparatus will be small and light weight, and will have a high cooling performance.

In addition, the present invention is a method for forming a heat sink. Using this method, a heat sink for transmitting the heat generated in the exothermic device to the casing via the heat spreader sheet can be formed, wherein part of the heat spreader sheet is made to abut against the exothermic device and another part of the heat spreader sheet is fixed to the inside wall surface of the casing by performing a preliminary step of preparing the circuit board with the exothermic device mounted, the casing for containing the circuit board, the heat spreader sheet made of materials having high thermal conductivity and flexibility, and the abutting member having a table-like external contour; a step of arranging the abutting member to the required position on the inside wall surface of the casing so that part of the heat spreader sheet abuts against the exothermic device when the circuit board has been contained in the casing; a step of fixing part of the heat spreader sheet to the inside wall surface of the casing after covering the abutting member and the inside wall surface of the casing with the heat spreader sheet; and a step of containing the circuit board in the casing so that the exothermic device faces the abutting member at least partially and the heat spreader sheet comes in contact with the exothermic device at the facing part. A heat sink of the present invention can be formed by this method. Particularly, the above-mentioned effects can be achieved by performing simple operations such as the forming of notches through such procedures that a plurality of line notches, which are not parallel to each other, are first formed on the heat spreader sheet and then the heat spreader sheet is bent along the direction crossing the line notches when the abutting member and the inside wall surface are covered with the heat spreader sheet.

DESCRIPTION OF THE PREFERRED EMBODIMENTS

Preferred embodiments of the present invention will now be described making reference to the accompanying drawings.

A First Embodiment

Figures 1A, 1B:
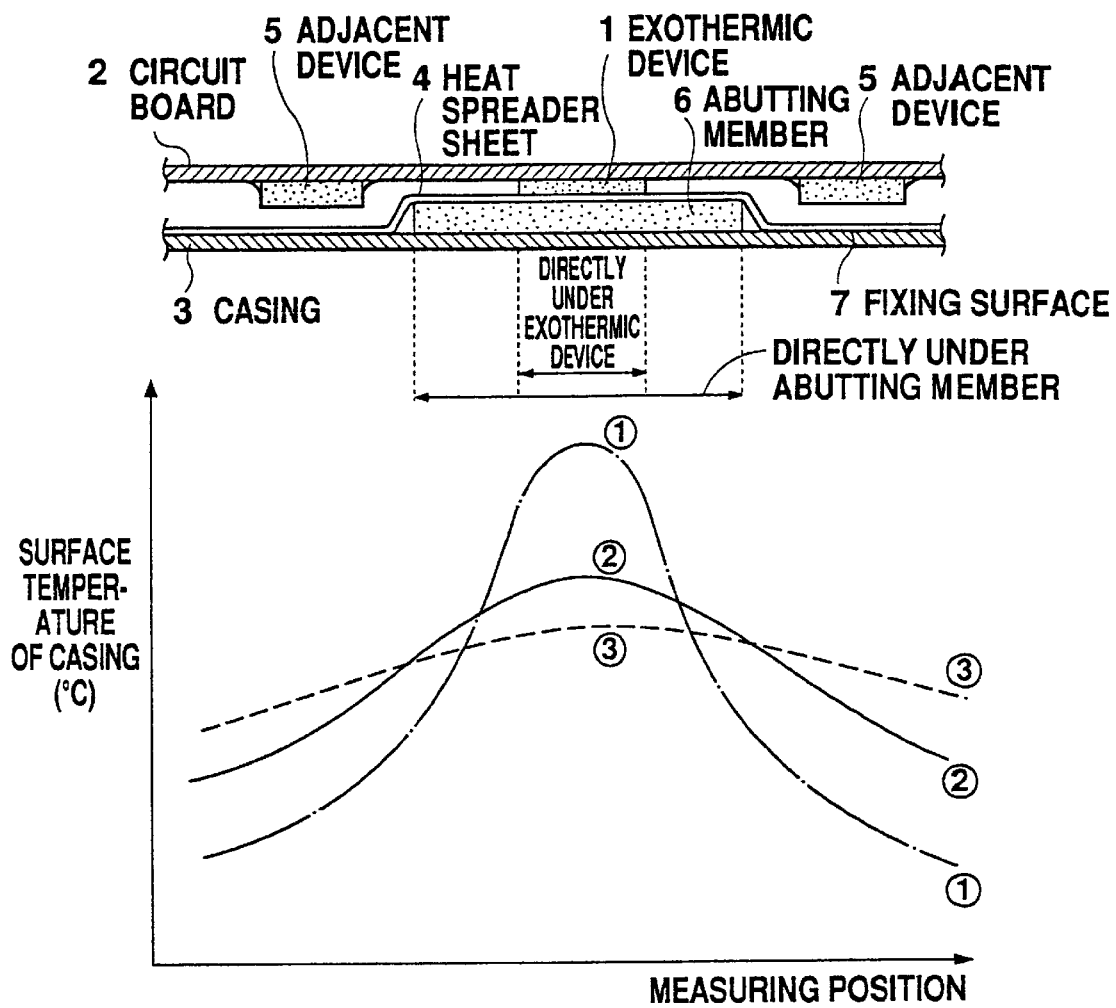
FIG. 1(a) and 1(b) are a cross-sectional view of a heat sink according to a first embodiment of the present invention and a graph showing effects of materials of an abutting member upon temperature distribution on a surface of a casing.

A cross-section of a heat sink according to a first embodiment of the present invention is shown in FIG. 1(a). In this embodiment, a heat spreader sheet 4 is fixed to an inside wall surface of casing 3 when circuit board 2 on which is mounted exothermic device 1, such as a microprocessor, is contained in casing 3 of a portable electronic apparatus. In this case, heat spreader sheet 4 is made to contact a surface (a high temperature surface) of exothermic device 1 by means of abutting member 6 on the inside wall surface of casing 3. In this case, heat spreader sheet 4 covers the inside wall surface of casing 3 as well as abutting member 6. Heat spreader sheet 4 is fixed to the inside wall surface of casing 3 at a portion other than the portion covering abutting member 6. Adhesive materials such as a heat conductive adhesive or a thermal grease are present on the inside wall surface of casing 3 and fixing surface 7 of heat spreader sheet 4, but are not shown in the figure because of their thinness.

By this structure of the present embodiment, transmission of heat from exothermic device 1 to heat spreader sheet 4 is efficient because the surface of exothermic device 1 contacts the surface of heat spreader sheet 4. In addition, the distance of heat transmission by heat spreader sheet 4 is short because heat spreader sheet 4 abuts exothermic device 1 with a shape conforming to the outside shape of abutting member 6. In addition, heat transmission from heat spreader sheet 4 to casing 3 is efficient because heat spreader sheet 4 is fixed to the inside wall surface of casing 3 with a heat conductive adhesive, a thermal grease, or the like. In addition, because heat transmission is carried out through abutting member 6, the heat transmission is more efficiently carried out than in the case of the structure shown in FIG. 7, wherein heat spreader sheet 4 is separated from the inside wall surface of casing 3 in the neighborhood of exothermic device 1. Generally speaking, in the present embodiment, excellent cooling performance can be obtained because the process of transmitting the heat generated in exothermic device 1 to casing 3 via heat spreader sheet 4 is efficient. Furthermore, it is possible to prevent contact of heat spreader sheet 4 with adjacent device 5, especially with lead wires or the like, because heat spreader sheet 4 conforms to the outside shape of abutting member 6. Consequently, the intervals between adjacent devices mounted on circuit board 2 can be reduced, and a heat sink more suitable for a compact electronic apparatus, that is, a portable electronic apparatus, than the structure shown in FIG. 7 can be obtained.

Figure 2:
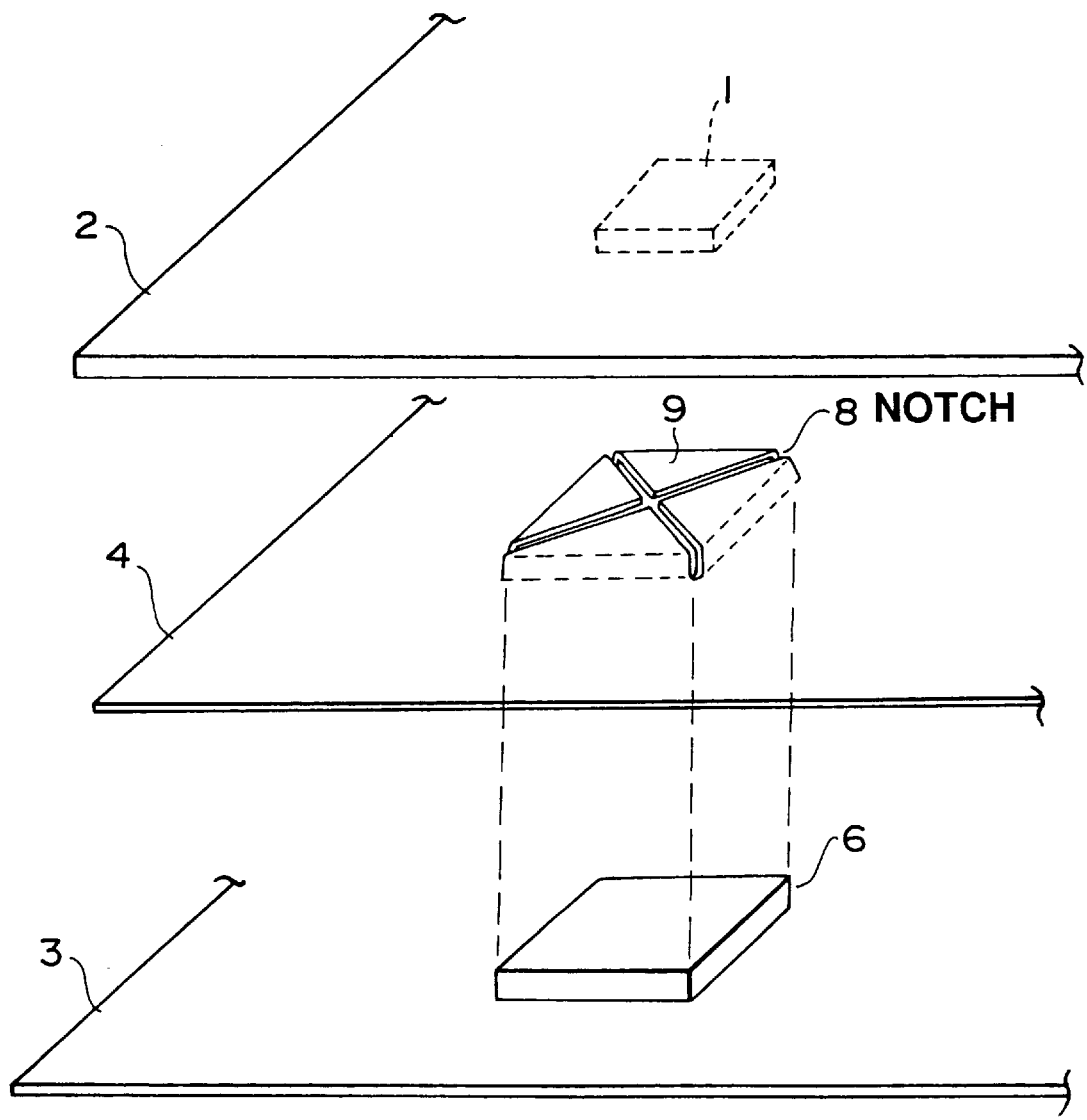
FIG. 2 is an exploded perspective view of a heat sink according to the first embodiment of the present invention.
Figure 3:
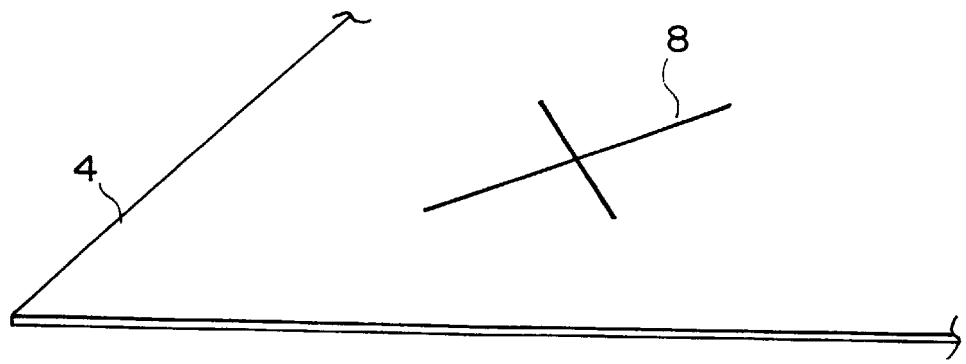
FIG. 3 is a perspective view showing a shape of a heat spreader sheet to be used for realizing a heat sink according to the first embodiment of the present invention.

In addition, in the present embodiment, the shape of heat spreader sheet 4 near the portion which comes into contact with exothermic device 1 is a shape conforming to the outside shape of abutting member 6 by adopting the structure and materials shown in FIGS. 2 and 3. That is to say, two crossing straight notches or slits 8 are first formed on heat spreader sheet 4 as shown in FIG. 3. When heat spreader sheet 4 covers the inside wall surface of casing 3 and abutting member 6 placed on casing 3, notches 8 expand and a projecting containing part 9 is formed as shown in FIG. 2. Therefore, a gentle slope of heat spreader sheet 4 in the neighborhood of containing part 9 for containing abutting member 6 can successfully be prevented. For this reason, the above-mentioned respective effects are furthermore enhanced.

The effects of the material chosen for abutting member 6 upon the surface temperature of casing 3 (temperature of the surface opposite to the fixing surface of abutting member 6 in FIG. 1(b) are shown in of FIG. 1. In FIG. 1, a first broken line shows the characteristics of an abutting member 6 composed of a resinous material, a second continuous line shows the characteristics of an abutting member 6 composed of metallic materials, and a third dashed line shows the characteristics of an abutting member 6 made of anisotropic thermally conductive materials. Particularly, the third curve shows the characteristics in the case where the anisotropic thermal conductivity is high in the direction parallel to the surfaces of circuit board 2 and casing 3 and low in the direction normal to these surfaces. It is clear from the figure that a local temperature rise of the casing surface can be suppressed in the order of resinous material, metallic material, and anisotropic thermal conductivity material arranged according to the above-mentioned method. It seems that this is due to the fact that the heat transmitted from exothermic device 1 via heat spreader sheet 4 can quickly be transmitted in the horizontal direction of FIG. 1(a) according to the above-mentioned order. Selection of these materials should appropriately be determined taking into consideration weight or the like in addition to the characteristics shown in FIG. 1(b). That is to say, though metallic materials generally have better characteristics than resinous materials in the characteristics shown in FIG. 1(b), use of resinous materials should be considered in some cases because metallic materials are generally heavy. In addition, because materials having anisotropic thermal conductivity are generally light, it is desirable to use materials having anisotropic thermal conductivity for cases where light weight is of greatest importance. Aluminum, copper, or the like or are examples of some metallic materials suitable for forming abutting member 6. C/CF (carbon/carbon fiber) composite material is one example of a material having anisotropic thermal conductivity. When a graphite sheet is used as heat spreader sheet 4, weight is remarkably reduced as the specific gravity of graphite is about ⅕ of that of copper sheet.

Second Embodiment

Figure 4:
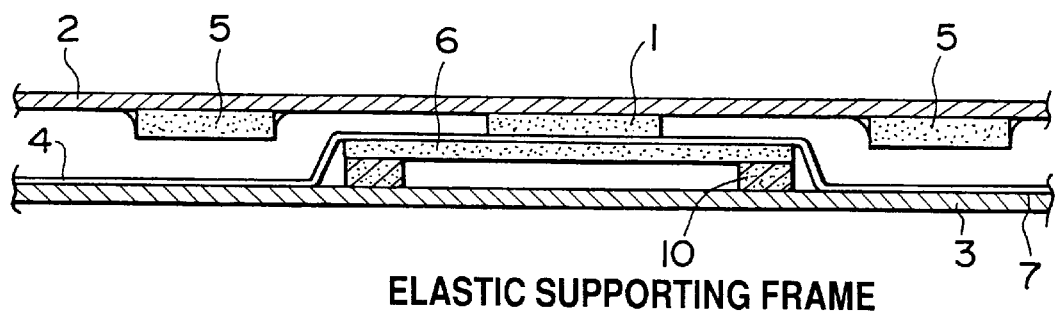
FIG. 4 is a cross-sectional view of the heat sink according to a second embodiment of the present invention.
Figure 5:
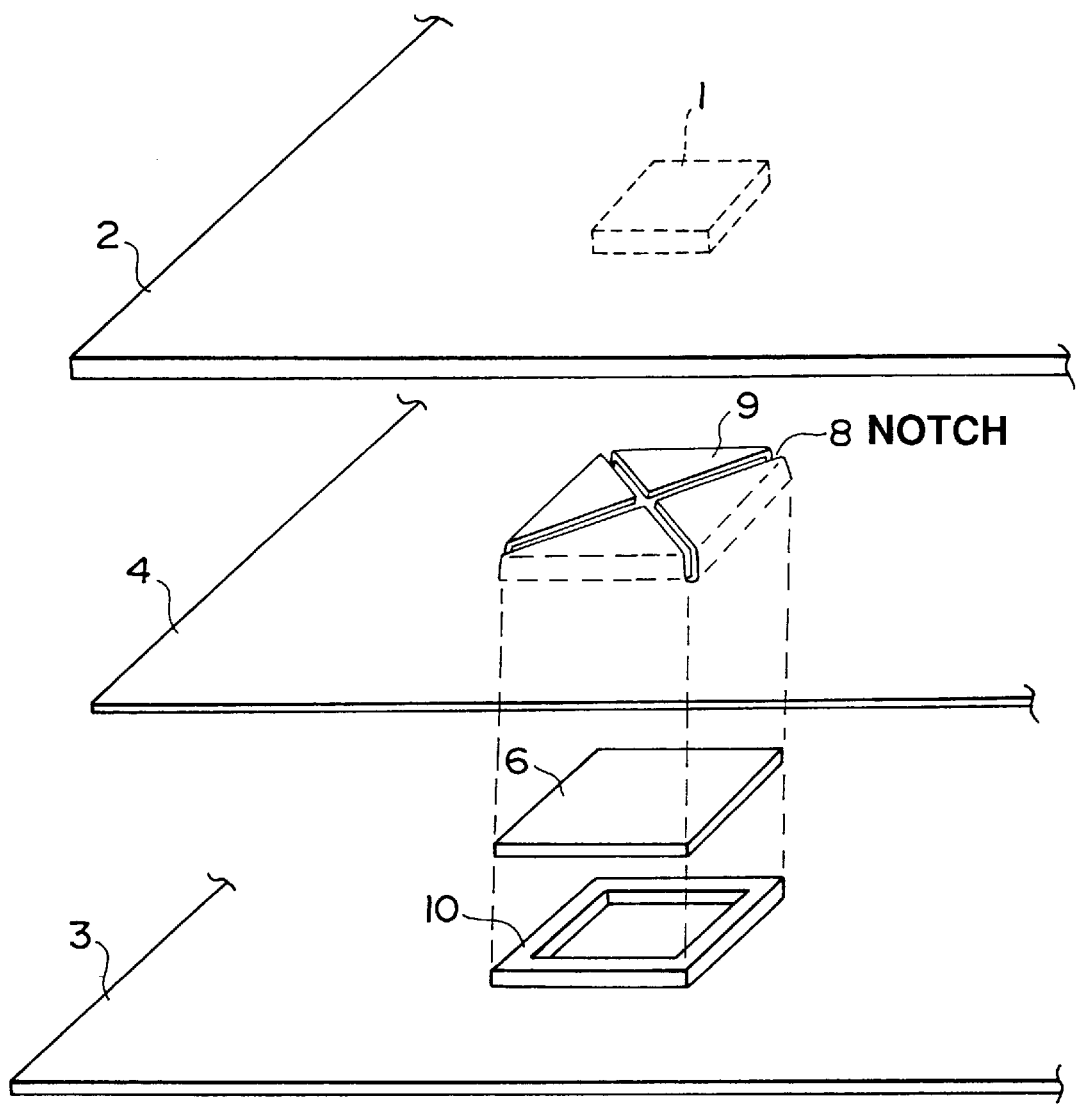
FIG. 5 is an exploded perspective view of the heat sink according to the second embodiment of the present invention.

A cross-section of a heat sink according to a second embodiment of the present invention is shown in FIG. 4. A forming method of the heat sink according to the second embodiment of the present invention is shown in FIG. 5. In this embodiment, elastic supporting frame 10 is arranged between abutting member 6 and the inside wall surface of casing 3. Elastic supporting frame 10 is a member having a square frame shape and elastically supporting abutting member 6 to cause the surface of heat spreader sheet 4 to suitably come in to contact with the surface of exothermic device 1, regardless of the spacing of mounted forms of exothermic device 1. By using such an elastic supporting frame 10, it is possible in the present embodiment to cause the surface of heat spreader sheet 4 to suitably come in to contact with the surface of exothermic device 1 without causing non-uniform load distribution. Consequently, it is possible to further efficiently transmit heat from exothermic device 1 to heat spreader sheet 4, and to protect this exothermic device 1 from the non-uniform load distribution or, in other words, from breakage due to stress concentration, especially when the exothermic device is a delicate element such as a bare chip.

In addition, there is an aerial layer inside elastic supporting frame 10, and this aerial layer prevents thermal conduction from abutting member 6 to casing 3. In the present embodiment, local temperature rise of the surface of casing 3 is prevented by utilizing this effect. That is to say, in such a configuration that the whole surface of abutting member 6 comes in contact with the surface of casing 3, like the first embodiment, the temperature at the part of casing 3 just under exothermic device 1 rises locally due to the heat generated in exothermic device 1. On the contrary, in the present embodiment, because heat transmission from exothermic device 1 to casing 3 is carried out via elastic supporting frame 10 and heat spreader sheet 4, most of the heat generated in exothermic device 1 is transmitted along heat spreader sheet 4. Accordingly, local temperature rise at the part just under exothermic device 1, which gives an anxious feeling to a user, hardly occurs. In addition, in order to make this aerial heat insulation further effective, it is desirable to make heat spreader sheet 4 using a material having higher thermal conductivity in the horizontal direction in the figure, for instance, the anisotropic thermal conductivity material described above.

Third Embodiment

Figure 6:
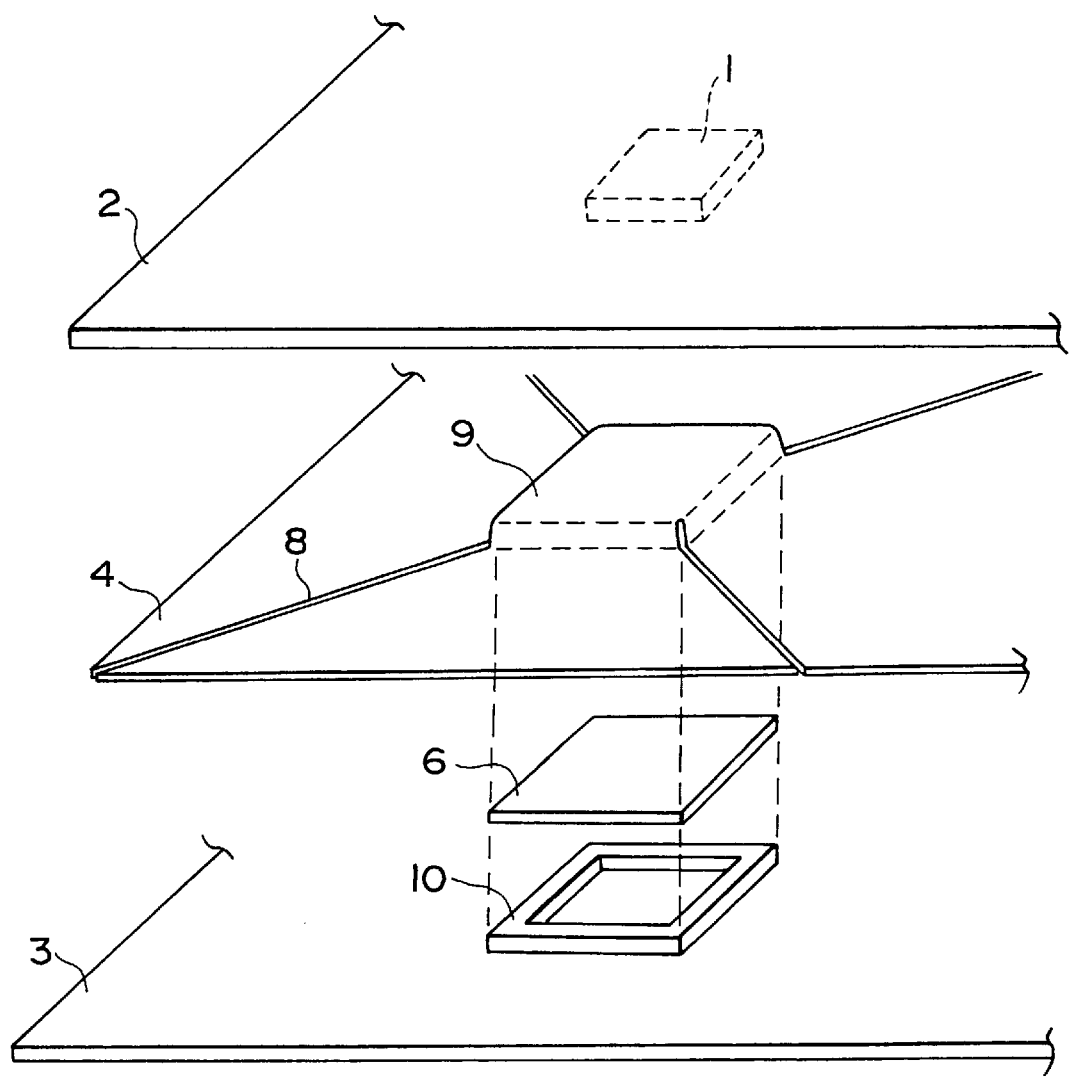
FIG. 6 is an exploded perspective view of a heat sink according to a third embodiment of the present invention.
Figure 11:
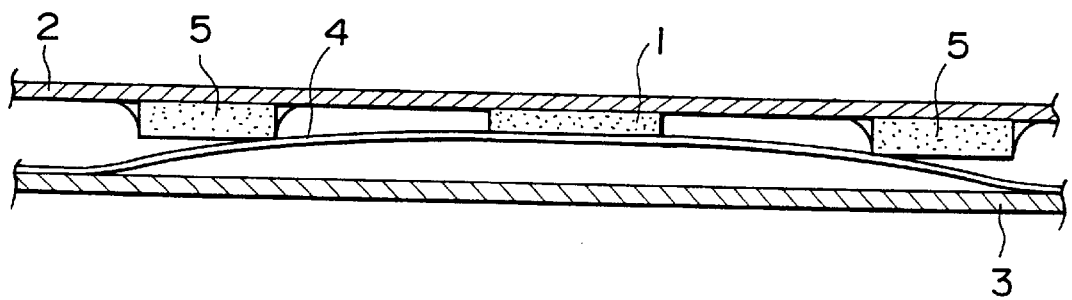
FIG. 11 is a cross-sectional view of a heat sink of a reference example.

A cross-section of a heat sink according to a third embodiment of the present invention is shown in FIG. 6. In this embodiment, notches or slits 8 are arranged from the corners of the area of projected containing part 9, toward the outside in a radial direction rather than within the area of projected containing part 9. By such a structure, effects similar to those of the second embodiment can be realized. Notches 8 in the present embodiment may be curved notches.

Fourth Embodiment

Figure 7:
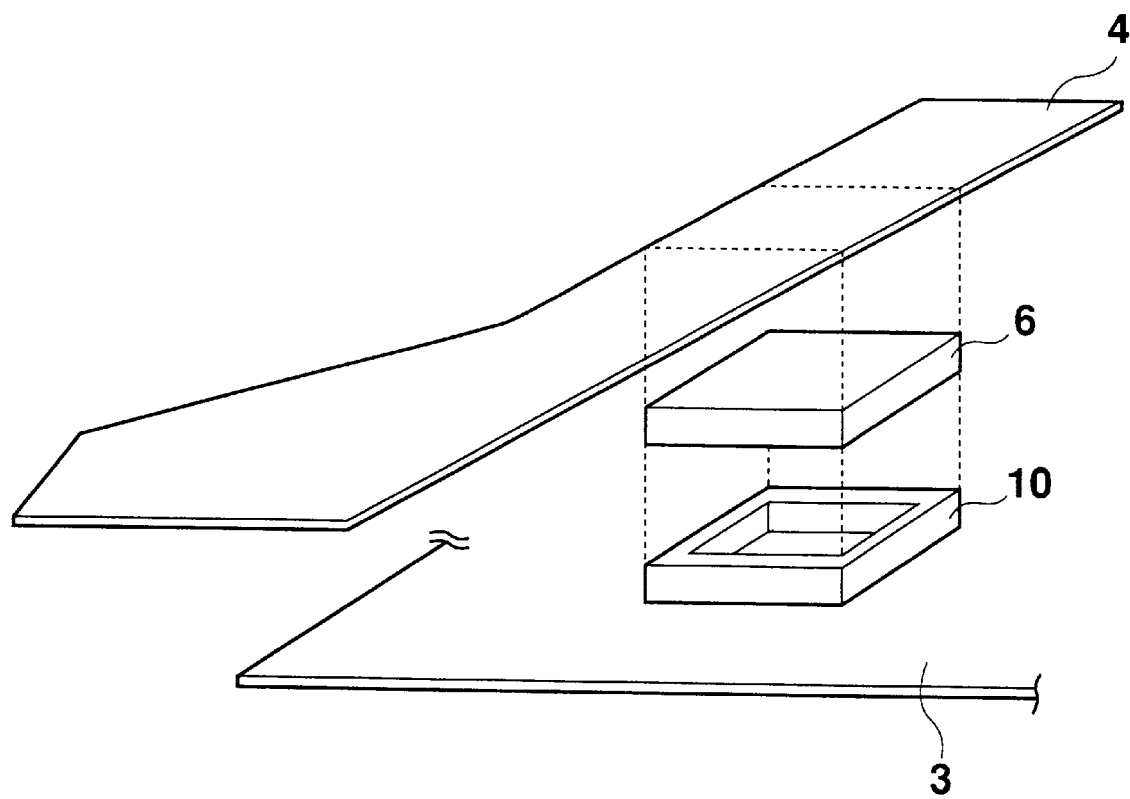
FIG. 7 is an exploded perspective view of a heat sink according to a fourth embodiment of the present invention, particularly showing a shape of the heat spreader sheet.
Figure 8:
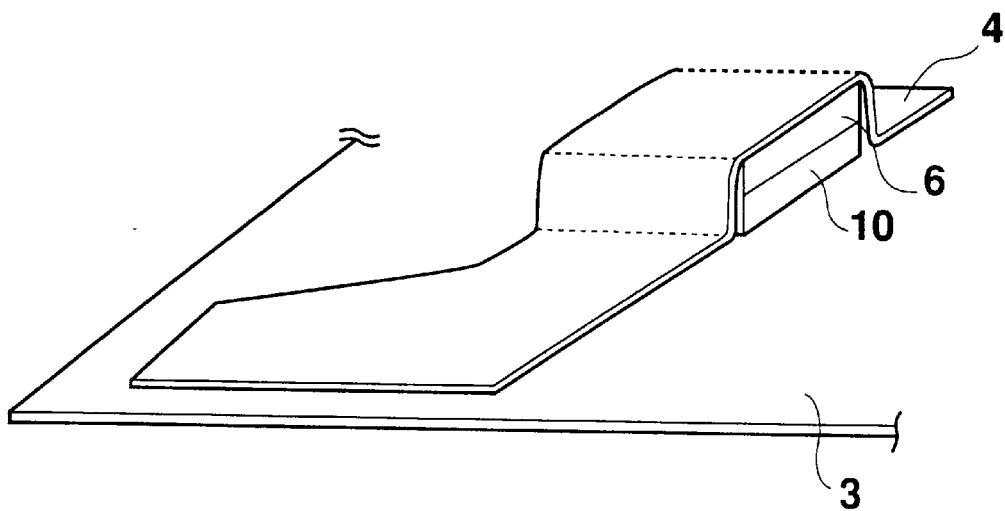
FIG. 8 is a perspective view of the heat sink according to the fourth embodiment of the present invention.

A structure of a heat sink according to a fourth embodiment of the present invention is shown in FIGS. 7 and 8. In the present embodiment, a portion of the heat spreader sheet 4 which covers abutting member 4 has a belt-like shape. This belt-like part is bent along the outside contour of abutting member 4 (and elastic supporting frame 10). In this manner, it is possible to easily form a projected containing part without first preparing notches.

Fifth Embodiment

Figure 9:
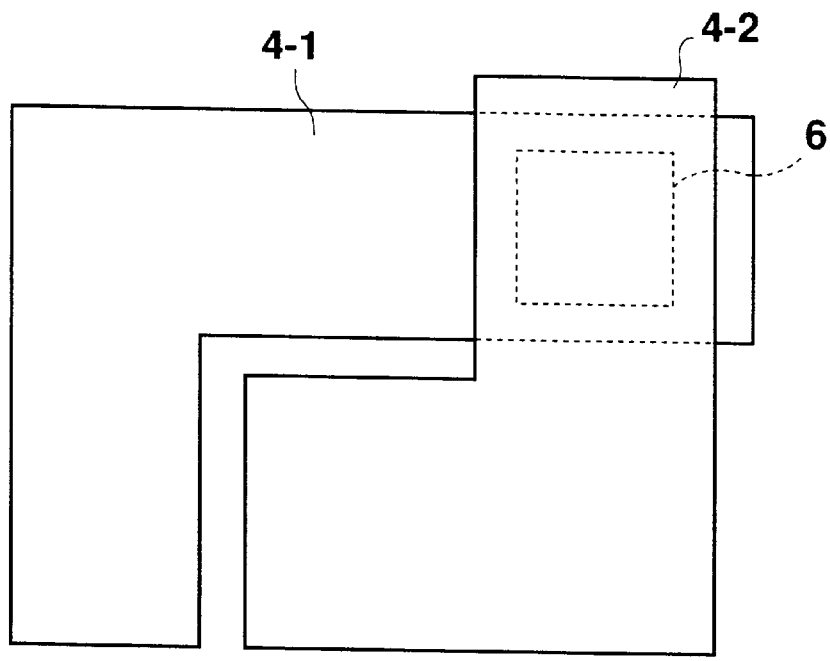
FIG. 9 is a top view of a heat sink according to a fifth embodiment of the present invention, particularly showing two heat spreader sheets and their shapes.

A structure of a heat sink according to a fifth embodiment of the present invention is shown in FIG. 9. It is possible to cover abutting member 6 by overlapping a plurality of heat spreader sheets 4-1 and 4-2 as shown in FIG. 9.

Sixth Embodiment

Figure 10:
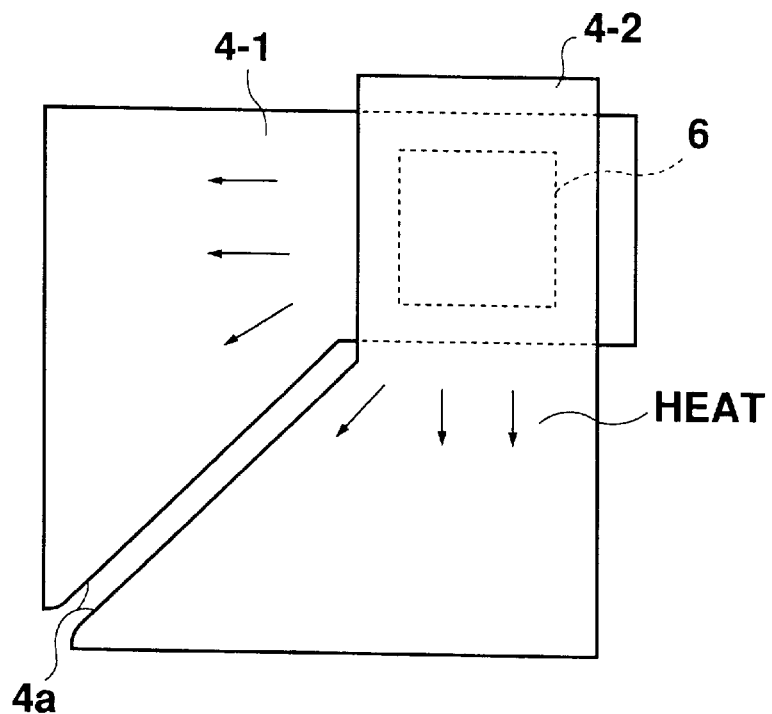
FIG. 10 is a top view of a heat sink according to a sixth embodiment of the present invention, particularly showing two heat spreader sheets and their shapes.

A structure of a heat sink according to a sixth embodiment of the present invention is shown in FIG. 10. In the present embodiment, edges 4a of heat spreader sheets 4-1 and 4-2 are obliquely cut so that these edges 4a are approximately parallel to the direction of heat flow (indicated by the arrows in FIG. 10), thereby improving thermal conduction along heat spreader sheets 4-1 and 4-2.

In the foregoing explanation, elastic supporting frame 10 was explained as a member having a square frame shape. However, a simple solid block or a sheet having no central aperture may also be used, as may many members having other shapes. In addition, abutting member 6 may have a shape of a rectangular parallelepiped with rounded corners, or of a circular cylinder. In addition, though for simplicity the above-mentioned embodiments were described in terms of one abutting member 6 provided for one exothermic device 1, it is not objectionable that, for example, one abutting member 6 be provided for a plurality of exothermic devices 1 or a plurality of abutting members 6 be provided for a single exothermic device 1.

Further, although in the above explanation, the present invention has been explained in terms of a heat sink, a method for forming the heat sink, and a portable electronic apparatus using the heat sink, a person of ordinary skill in the art may interpret and represent the present invention as the invention in other categories on the basis of the matters disclosed explicitly or implicitly in the present application and the common knowledge in the art, and the present invention includes all such modifications.

What is claimed is:

1. A heat sink assembly for transmitting heat generated in an exothermic device to a low temperature surface comprising:

an exothermic device producing heat during operation;

a circuit board on which the exothermic device is mounted;

a low temperature member having opposed internal and external surfaces, the internal surface facing the circuit board, the exothermic device being disposed between the circuit board and the low temperature member;

an abutting member arranged on the internal surface of the low temperature member, having a substantially rectangular parallelepiped shape, facing the exothermic device, and projecting toward the exothermic device; and a flexible, thermally conductive heat spreader sheet free of grooves parallel to edges of the abutting member, covering and fixed to part of the internal surface of the low temperature member, and contacting and generally conforming to the substantially rectangular parallelepiped shape of the abutting member, wherein a portion of the heat spreader sheet is urged against the exothermic device by the abutting member so that heat generated in the exothermic device is transmitted to the low temperature member via the heat spreader sheet.

2. The heat sink assembly according to claim 1 wherein the heat spreader sheet comprises a containing part receiving the abutting member, the containing part being formed by bending the heat spreader sheet along a direction crossing a plurality of non-parallel linear slits in the heat spreader sheet.

3. The heat sink assembly according to claim 1 wherein the abutting member has a width, the heat spreader sheet comprises a belt-like part having a width substantially equal to the width of the abutting member, and the belt-like part includes a containing part for receiving the abutting member.

4. The heat sink assembly according to claim 1 including a thermally conductive adhesive fixing part of the heat spreader sheet to the internal surface of the low temperature member.

5. A heat sink assembly for transmitting heat generated in an exothermic device to a low temperature surface comprising:

an exothermic device producing heat during operation;

a circuit board on which the exothermic device is mounted;

a low temperature member having opposed internal and external surfaces, the internal surface facing the circuit board, the exothermic device being disposed between the circuit board and the low temperature member;

an abutting member arranged on the internal surface of the low temperature member, having a substantially rectangular parallelepiped shape, facing the exothermic device, and projecting toward the exothermic device;

a flexible, thermally conductive heat spreader sheet free of grooves parallel to edges of the abutting member, covering and fixed to part of the internal surface of the low temperature member, and contacting and generally conforming to the substantially rectangular parallelepiped shape of the abutting member, wherein a portion of the heat spreader sheet is urged against the exothermic device by the abutting member so that heat generated in the exothermic device is transmitted to the low temperature member via the heat spreader sheet; and an elastic supporting frame located between the abutting member and the internal surface of the low temperature member for uniformly distributing stress due to the heat spreader sheet and the exothermic device.

6. A heat sink assembly for transmitting heat generated in an exothermic device to a low temperature surface comprising:

an exothermic device producing heat during operation;

a circuit board on which the exothermic device is mounted;

a low temperature member having opposed internal and external surfaces, the internal surface facing the circuit board, the exothermic device being disposed between the circuit board and the low temperature member;

an abutting member arranged on the internal surface of the low temperature member, having a substantially rectangular parallelepiped shape, facing the exothermic device, and projecting toward the exothermic device;

a spacer including an air retaining internal volume, the spacer being located between the abutting member and the internal surface of the low temperature member; and a flexible, thermally conductive heat spreader sheet free of grooves parallel to edges of the abutting member, covering and fixed to part of the internal surface of the low temperature member, and contacting and generally conforming to the substantially rectangular parallelepiped shape of the abutting member, wherein a portion of the heat spreader sheet is urged against the exothermic device by the abutting member so that heat generated in the exothermic device is transmitted to the low temperature member via the heat spreader sheet.

7. The heat sink assembly according to claim 1 wherein the abutting member is made of a material selected from the group consisting of resinous materials, metallic materials, and anisotropic materials having a relatively high thermal conductivity in a direction parallel to the circuit board and the internal surface of the low temperature member and a relatively low thermal conductivity in a direction transverse to the internal surface of the low temperature member.

8. The heat sink assembly according to claim 5 wherein the supporting frame is made of a material selected from the group consisting of resinous materials, metallic materials, and anisotropic materials having a relatively high thermal conductivity in a direction parallel to the circuit board and the internal surface of the low temperature member and a relatively low thermal conductivity in a direction transverse to the internal surface of the low temperature member.

9. The heat sink assembly according to claim 6 wherein the spacer is made of a material selected from the group consisting of resinous materials, metallic materials, and anisotropic materials having a relatively high thermal conductivity in a direction parallel to the circuit board and the internal surface of the low temperature member and a relatively low thermal conductivity in a direction transverse to the internal surface of the low temperature member.

10. The heat sink assembly according to claim 1 wherein edges of the heat spreader sheet are parallel to a direction of the heat flow through the heat spreader sheet from the exothermic device to the low temperature member.

11. The heat sink assembly according to claim 7 wherein the abutting member comprises a carbon-carbon fiber composite material having an anisotropic thermal conductivity.

12. The heat sink assembly according to claim 8 wherein the supporting frame comprises a carbon-carbon fiber composite material having an anisotropic thermal conductivity.

13. The heat sink assembly according to claim 9 wherein the spacer comprises a carbon-carbon fiber composite material having an anisotropic thermal conductivity.

14. The heat sink assembly according to claim 1 including at least one additional exothermic device producing heat during operation, mounted on the circuit board, spaced from the exothermic device, located between the circuit board and the internal surface of the low temperature member, and located opposite part of but not contacting the heat spreader sheet.

15. The heat sink assembly according to claim 5 including at least one additional exothermic device producing heat during operation, mounted on the circuit board, spaced from the exothermic device, located between the circuit board and the internal surface of the low temperature member, and located opposite part of but not contacting the heat spreader sheet.

16. The heat sink assembly according to claim 6 including at least one additional exothermic device producing heat during operation, mounted on the circuit board, spaced from the exothermic device, located between the circuit board and the internal surface of the low temperature member, and located opposite part of but not contacting the heat spreader sheet.

* * * * *